United States Patent [19]

Kalb

[11] Patent Number: 5,523,679
[45] Date of Patent: Jun. 4, 1996

[54] APPARATUS FOR DETECTING SPEED AND DIRECTION OF ROTATION WITH A SINGLE MAGNETIC SENSOR

[75] Inventor: Roland Kalb, Rossach, Germany

[73] Assignee: Brose Fahrzeugteile GmbH & Co. KG, Germany

[21] Appl. No.: 120,045

[22] Filed: Sep. 10, 1993

[30] Foreign Application Priority Data

Oct. 1, 1992 [DE] Germany ............... 42 33 549.3

[51] Int. Cl.$^6$ .................. G01P 3/52; G01P 13/04; G01P 3/481; G01B 7/14
[52] U.S. Cl. .................. 324/165; 324/174; 324/207.22; 324/207.25; 340/672
[58] Field of Search ............... 324/165, 207.22, 324/207.25, 207.2, 207.22, 174; 340/672

[56] References Cited

U.S. PATENT DOCUMENTS

| | | | |
|---|---|---|---|
| 3,132,337 | 5/1964 | Martin | 324/165 |
| 4,789,826 | 12/1988 | Willett | 324/207.2 |
| 5,264,789 | 11/1993 | Braun et al. | 324/207.22 |

FOREIGN PATENT DOCUMENTS

| | | | |
|---|---|---|---|
| 1773149 | 9/1971 | Germany | 324/165 |
| 2810155 | 9/1978 | Germany | 324/165 |
| 4038284A1 | 6/1992 | Germany . | |

Primary Examiner—Walter E. Snow
Attorney, Agent, or Firm—Christie, Parker & Hale

[57] ABSTRACT

The invention relates to a process and apparatus for detecting the speed and rotary direction of a rotary drive by using a signal-transmitting or signal-changing element which is connected rotationally secured to the rotary drive. According to the invention, during rotation of the signal-transmitting or signal-changing element a rotary direction coded signal is produced which is detected by a sensor and which is supplied to an electronic evaluator unit. The aim of the invention is to provide a process and device for detecting the speed and rotary direction of a rotary drive which manages with one sensor unit for a high analysis of the speed and rotary direction.

15 Claims, 5 Drawing Sheets

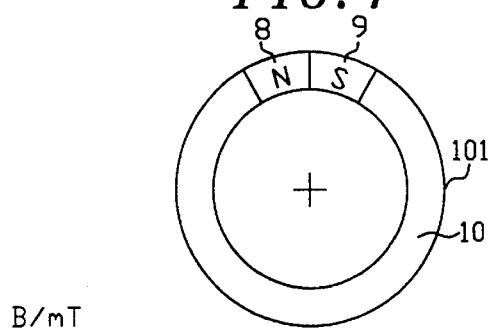
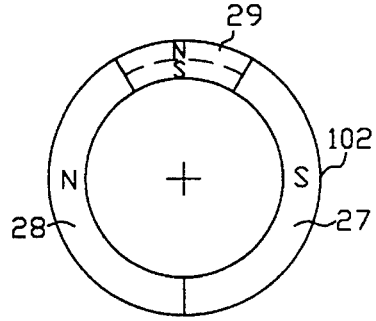
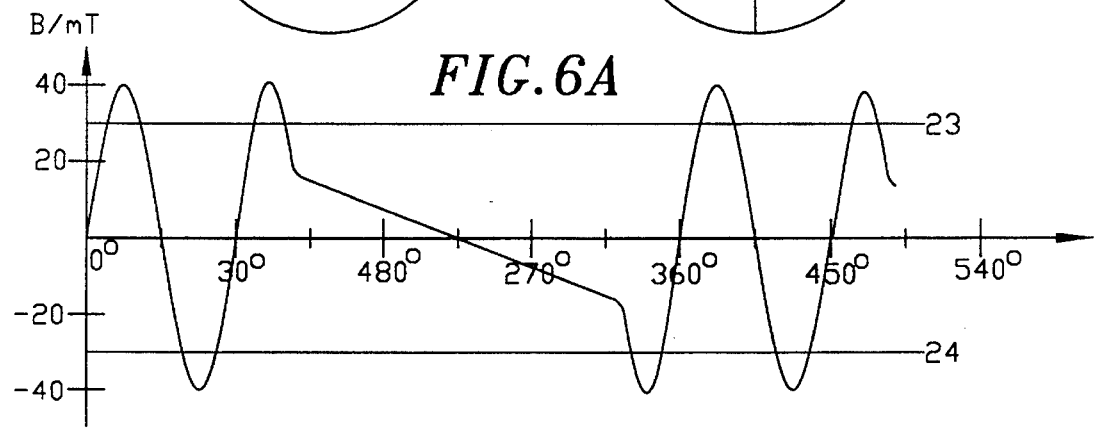
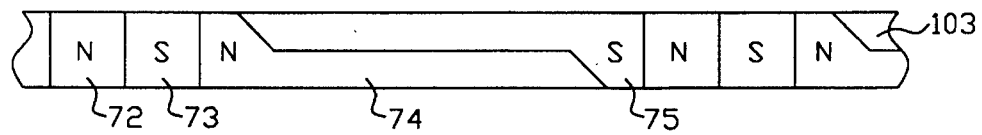
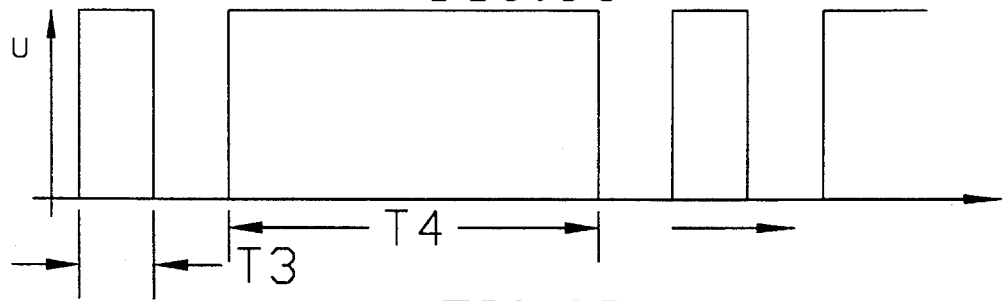
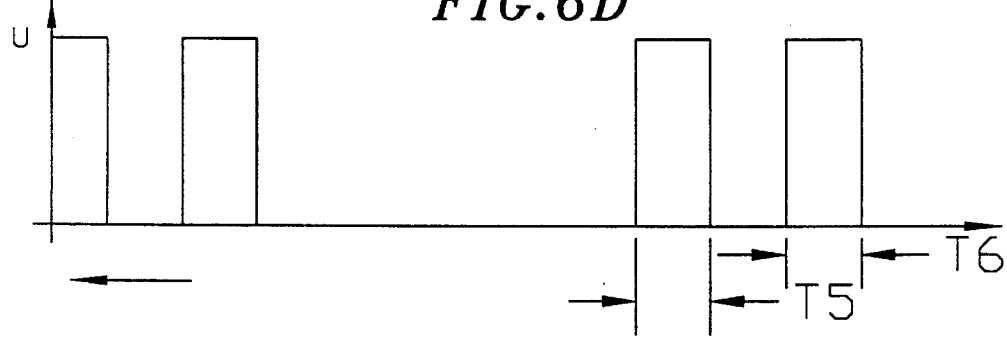

APPARATUS FOR DETECTING SPEED AND DIRECTION OF ROTATION WITH A SINGLE MAGNETIC SENSOR

BACKGROUND OF THE INVENTION

The invention relates to a process and device for detecting the speed and direction of rotation of a rotary drive.

It is known in the art to detect the speed and direction of rotation of a rotary drive by means of two Hall sensors off-set by 90°. To this end a N-S magnetized ring magnet is mounted centrally on the rotary drive axis and is connected rotationally secured thereto. During rotation of the ring magnet the two Hall sensors mounted at the sides of the ring magnet are each infiltrated by a variable magnetic field. The changes in the magnetic field thereby occurring at the two sensors are converted by a Schmitt trigger into two binary impulse sequences off-set by 90° relative to each other. By counting the number of impulses per unit time it is possible to determine the speed and by comparing the two impulse sequences it is possible to determine the direction of rotation of the rotary drive.

The disadvantage with this process is the expensive housing structure which results from using two Hall sensors and their 90° off-set arrangement. Connected with this is also the cost-intensive contacting and connection of the two Hall sensors.

From DE 40 38 284 A1 a process is known for detecting the position and direction of movement of translatory or rotary moving parts of an assembly which derives from a rotary drive of the assembly numerical impulses in rotary direction coded impulse sequences or numerical impulses with rotary direction coded form. To this end in particular a disc is provided connected to the rotary drive and having a ring with a predetermined number of marks arranged in sequence. Next to the disc in the area of the ring is a Hall sensor which responds to these marks.

SUMMARY OF THE INVENTION

The object of the invention is to provide a process and device for detecting the speed and rotary direction of a rotary drive which manages with one sensor unit for a high analysis of the speed and rotary direction and thus has a low production expense.

According to the invention, a process for detecting the speed and direction of rotation of a rotary drive comprises rotating a rotary drive, generating a periodic, rotary direction coded signal in dependence on the rotation of the rotary drive, detecting said coded signal by means of a sensor, and evaluating said coded signal with respect to the speed and direction of rotation of the rotary drive.

The solution according to the invention makes it possible by using a rotary direction coded signal to detect the speed and direction of rotation with only one sensor. The periodic rotary direction coded signal emerging at the sensor is supplied to an electronic evaluator unit which detects the rotations of the signal-transmitting or signal-changing element and undertakes decoding of the rotary direction information. In this way the speed and rotary direction of the rotary drive is determined with high precision.

When using a signal-transmitting element a signal is produced at the sensor during rotation of the signal-transmitting element and when using a signal-changing element an existing starting signal is changed at the sensor during rotation of the signal-changing element.

The periodic rotary direction coded signal to be evaluated has at least one extreme value wherein when approaching the extreme value from different sides differently rising or dropping signal amplitudes are present and/or the extreme values are unevenly distributed with regard to a 360° period. In the latter case the extreme values have at least one division which is different from the ratio of 360° to the number of extreme values. The rotary direction coding of the signal detected at the sensor is produced according to the two aforesaid variants from the form of the signal amplitude and/or from the distribution of the extreme values of the signal within one period.

In a preferred embodiment of the invention the signal-transmitting element has at least one permanent magnet so that during rotation of the signal-transmitting element a rotary direction coded magnetic field is produced at the sensor. More particularly, a closed permanent magnetic ring is used as the permanent magnet.

The rotary direction coding of the magnetic field detected by the sensor is preferably carried out by an eccentric rotation of the permanent magnetic ring about the rotary drive axis. The permanent magnetic ring is hereby N-S magnetized. The magnetic field varies periodically at the sensor in dependence on the distance of the ring from the sensor. Depending on the rotary direction of the rotary drive two different signals are produced which contain the rotary direction information.

Alternatively, the rotary direction coding of the magnetic field can be carried out, in the case of a central arrangement of the permanent magnetic ring, through corresponding coding of the magnetic field of the ring. To this end the permanent magnetic ring has several magnetized sensors along its circumference which are arranged unevenly and/or have different sizes.

It is likewise possible to arrange a rotary direction coded permanent magnetic ring in addition eccentric to the rotary drive axis. This leads to overlapping of the two effects leading to a rotary direction coding.

In an alternative design of the invention the magnetic flux density is changed periodically during rotation of the signal-changing element in a magnetic circuit. The change in the magnetic flux density is thereby carried out as a result of the different strength magnetic coupling of the signal-changing element in the magnetic circuit which is dependent on the rotary position of the rotating element. With a non-rotationally-symmetrical three-dimensional design of the signal-changing element, the change in the magnetic flux density is rotary direction coded.

Current or voltage changes occurring at the sensor as a result of the rotary direction coded signal are evaluated by the electronic evaluator unit. Preferably, the evaluation is carried out so that an analog voltage occurring at the sensor is converted by an impulse circuit into a binary numerical impulse sequence. By counting the impulses within a predetermined time section and decoding the rotary direction information it is possible to detect the speed and direction of rotation of the rotary drive with high precision.

In order to convert the analog rotary direction coded voltage occurring at the sensor into a binary numerical impulse sequence, it is preferable to use a threshold value switch, more particularly a Schmitt trigger. A threshold value switch is a bistable rocker circuit which tips back on exceeding a preset upper switch threshold and on falling below a preset lower switch threshold.

As a result of the rotary direction coding, the two binary numerical impulse sequences, which arise with the two possible rotary direction of the rotary drive, have numerical impulses with partially or completely different impulse lengths. In order to determine the rotary direction of the rotary drive, the impulse length of the detected impulse sequence as well as, where applicable, the ratio of the impulse lengths of two successive numerical impulses are formed and compared with preset numerical values. A rotation in the clockwise direction or a rotation anti-clockwise is then present in dependence on the detected value for the impulses length or for the ratio of the impulse lengths of two successive numerical impulses.

The impulse lengths occurring in a numerical impulse sequence depend on the coding carried out of the original signal detected by the sensor.

The device for detecting the speed and direction of rotation of a rotary drive comprises a rotary drive, a signal transmitting or signal-changing element connected rotationally secured to the rotary drive for generating a periodic, rotary direction coded signal, a sensor being locally fixed at a radial distance from the signal transmitting or signal-changing element, and an evaluator unit, the input of which is connected to said sensor. During rotation of the signal-transmitting or signal-changing element, the sensor detects the periodic rotary direction coded signal arising during rotation.

Preferably, the signal-transmitting element is a closed permanent magnetic ring which consists of two equal-sized sectors of different polarity and which is connected eccentrically to the rotary drive axis. Between the eccentrically mounted permanent magnetic ring and the rotary drive axis there is preferably a ring-like filler element such as an iron ring. The filler element increases the mechanical strength of the assembly and lowers the magnetic resistance of the permanent magnetic ring.

In another embodiment of the invention, the signal transmitting element is rotary direction coded by means of irregularly arranged sectors. One or more sectors of equal or different size are thereby provided for the rotary direction coding which are either not magnetized or not magnetizable or whose magnetization is directed so that they produce hardly any magnetic field at the sensor.

In a further embodiment of the invention, the signal-changing element is part of a magnetic circuit. It thereby has a non-rotationally-symmetrical outer contour. The magnetic circuit is formed by a core of specific magnetic permeability and a current-permeated coil, or a permanent magnetic core and a non-energy-biased coil. The signal-changing element is coupled contactless in the magnetic circuit. The current or voltage fluctuations of the current-permeated coil or the voltages and currents induced at the coil input are used as the basis for the signal evaluation. The coil thereby serves as a sensor.

BRIEF DESCRIPTION OF THE DRAWINGS

The features of specific embodiments of the best mode contemplated of carrying out the invention are illustrated in the drawings in which:

FIG. 4 shows a centrally mounted permanent magnetic ring with a non-magnetic sector;

FIG. 5 shows a permanent magnetic ring with a differently magnetized sector;

FIGS. 6a–6d show diagrammatically the path of the magnetic flux density at a Hall sensor for the permanent magnetic ring shown opened, as well as the corresponding numerical impulse sequences for both rotary directions;

DETAILED DESCRIPTION OF THE SPECIFIC EMBODIMENT

Figure 1:
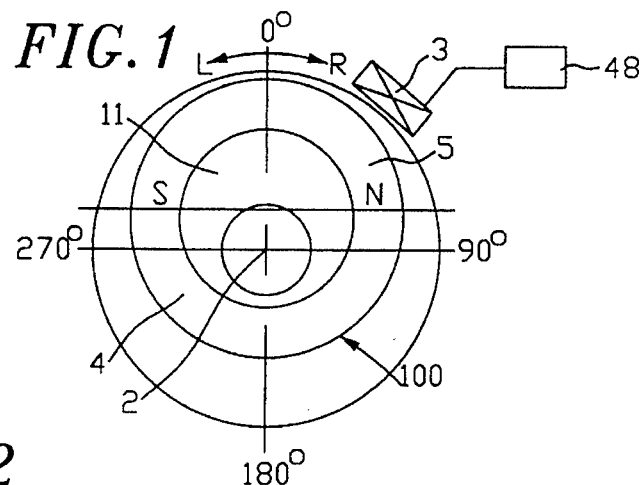
FIG. 1 is a cross-section through an arrangement according to the invention with an eccentrically mounted permanent magnetic ring and Hall sensor.

FIG. 1 shows an N-S magnetized permanent magnetic ring 100 mounted eccentrically on a rotary drive axis 2 and having two equal size hemi-circular sectors 4, 5 of opposite polarity. The axial extension of the permanent magnetic ring 100 amounts, for example, to 15 mm. A Hall sensor 3 with incorporated Schmitt trigger (not shown) is mounted at a radial distance at the side of the permanent magnetic ring 100. The output of the Schmitt trigger is connected to an evaluator unit 48. Between the permanent magnetic ring 100 and the rotary drive axis 2 is an iron ring 11 which guarantees in particular the mechanical strength of the arrangement.

Figure 2:
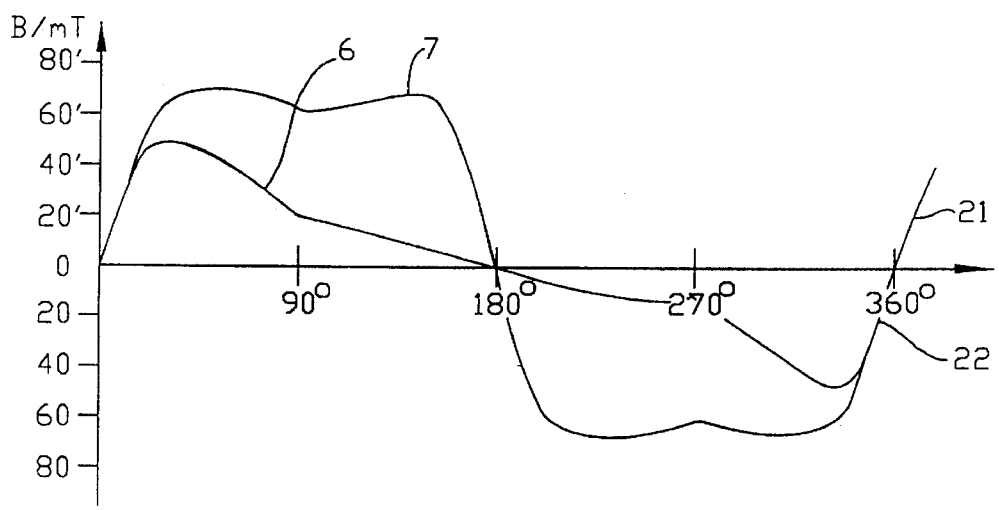
FIG. 2 shows the path of the magnetic flux density at an Hall sensor over an angular range of 360° in an arrangement according to FIG. 1.

During rotation of the permanent magnetic ring 100 the magnetic flux density 6 shown in FIG. 2 in dependence on the rotary angle adjoins the Hall probe 3.

The magnetic flux density 6 varies in dependence on the distance of the eccentric permanent magnetic ring 100 from the echo sensor 3 and has in this embodiment a maximum at about 25° and a minimum at about 335°. As can be easily seen, the magnetic flux density 6 runs with the reverse direction of rotation mirror symmetrical relative to the source coordinates. However, the maximum and minimum, i.e., the opposite peaks, are unevenly spaced as a function of angular displacement as the rotary drive rotates about axis 2.

The path of the magnetic flux density 7 of a centrally mounted N-S magnetized permanent magnetic ring 100 is likewise shown for comparison in FIG. 2. In this case the magnetic flux density 7 has two evenly spaced opposite peaks as a function of angular displacement as the rotary drive rotates about axis 2.

Figure 3:
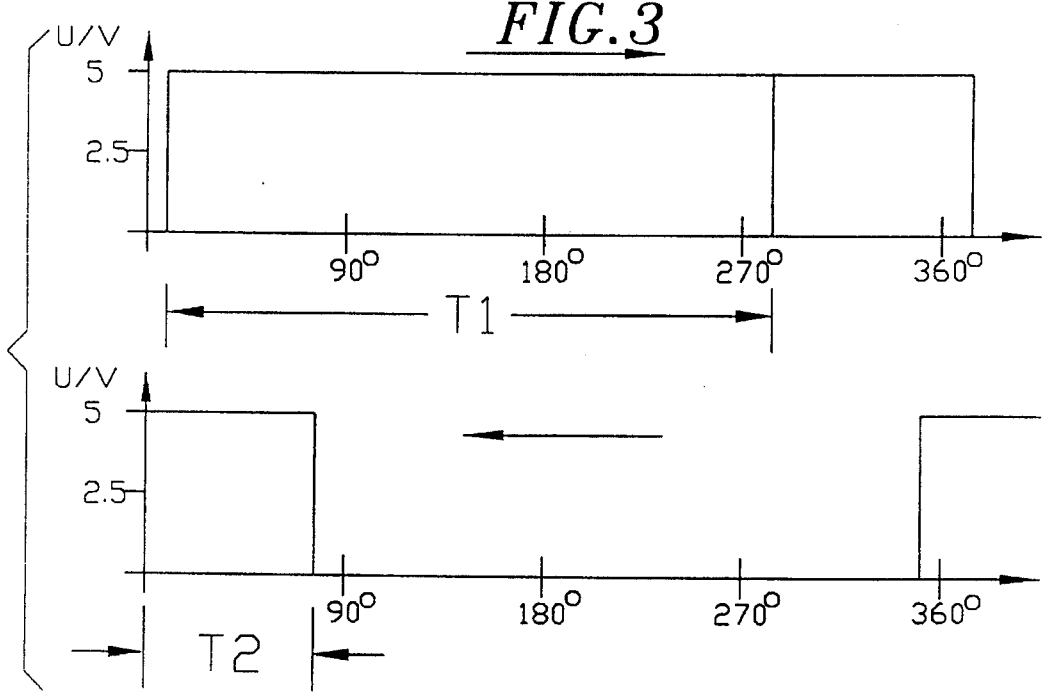
FIG. 3 shows the path of a binary numerical impulse sequence with a magnetic flux density adjoining a Hall sensor according to FIG. 2.

The magnetic flux density 6 adjoining the Hall sensor 3 produces a Hall voltage which is (substantially) proportional to the magnetic flux density 6 and which is converted by means of the Schmitt trigger into a binary numerical impulse sequence according to FIG. 3. With the illustrated embodiment the upper switch threshold 21 of the Schmitt trigger amounts to twenty mT and the lower switch threshold 22 to minus twenty mT.

For the two possible rotary directions, hereinafter called right and left, two numerical impulse sequences are thereby produced which are characterized by a different impulse length T1 and T2 of the individual numerical impulses. On exceeding twenty mT the output voltage U of the echo sensor jumps to HIGH, here a value of 5 volts, and on falling below minus twenty mT jumps to LOW, here a value of 0 volt.

The rotary direction information is produced from the impulse length T1 and T2 of the individual numerical impulses. To this end the existing impulse length is compared in the connected electronic evaluator unit 48 with two predetermined numerical values. The speed of rotation of the rotary drive is determined by counting the number of pulses in a defined time interval.

FIG. 4 shows a permanent magnetic ring 101 which is characterized by two small adjacent permanent magnetic sectors 8, 9 of opposite magnetic polarity and a large adjoining non-magnetized sector 10. With a central arrangement and rotation of this permanent magnetic ring 101 the same magnetic flux density distribution arises as in FIG. 3.

The ring 102 shown in FIG. 5 has in addition to two circumferentially adjacent permanent magnetic sectors 27, 28 of opposite magnetic polarity a sector 29 which is magnetized in the radial direction N-S so that the magnetic field lines run in this sector 29 toroidal round the ring and produce at the sensor 3 substantially no change in the magnetic flux density. The ring 102 consists of a plastics in which magnetizable particles can be embedded. Each area of the ring 102 can therefore be magnetized in any way. A ring of this kind can be used both with a central and with an eccentric arrangement of the ring in relation to the rotary drive axis 2.

FIG. 6b shows a further arrangement of a permanent magnetic ring 103. Here the permanent magnetic ring 103 consists of two smaller sectors 12, 13 and two larger sectors 14, 15. Sectors 12, 13 are circumferentially adjacent to each other; sectors 14, 15 are radially adjacent to each other and circumferentially adjacent to sectors 12, 13. The sectors 14, 15 are provided so that the gradient of the magnetic flux density is substantially constant along the sectors 14, 15. The corresponding path of the magnetic flux density 16 is shown in FIG. 6a. Note that there are two pairs of unevenly spaced opposite peaks as a function of angular displacement. For the marked switch thresholds 23, 24 of 30 mT and −30 mT, respectively, the numerical impulse sequence shown in FIG. 6c is produced as digital output voltages U of the Hall sensor in the case of right hand rotation and the numerical impulse sequence shown in FIG. 6d is produced in the case of left hand rotation.

With right hand rotation the numerical impulse sequence has numerical impulses of two different impulse lengths T3, T4 which change alternately. The touch ratios of the two impulse lengths T3, T4 is different from 1, in the illustrated embodiment T4/T3 is =5.

With left-hand rotation however, the individual numerical impulses have a uniform length T5, T6 so that the touch ration T5/T6 is =1. The direction of rotation of the rotary drive can thus be detected by determining the touch ratio.

Still easier is the comparison of the length of the HIGH level of the signal with the length of the preceding HIGH level.

Figure 7A:
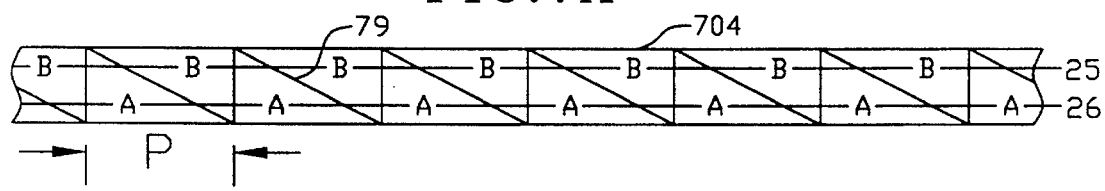
FIGS. 7a–7c show a permanent magnetic ring opened and the numerical impulse sequences occurring with this permanent magnetic ring for both rotary directions.

FIG. 7a shows a further permanent magnetic ring 104 which is connected centrally to the rotary drive axis 2. This permanent magnetic ring 104 consists of an even number of sectors A, B having a pair of diagonally oriented permanent magnets of opposite magnetic polarity wherein the path of the magnetic flux density, as shown diagrammatically in FIG. 7a, is described by a saw tooth curve 19 whose period P corresponds to the length of two sectors A, B. The two switch thresholds 25, 26 for the Schmitt trigger are likewise marked diagrammatically.

Figure 7B:
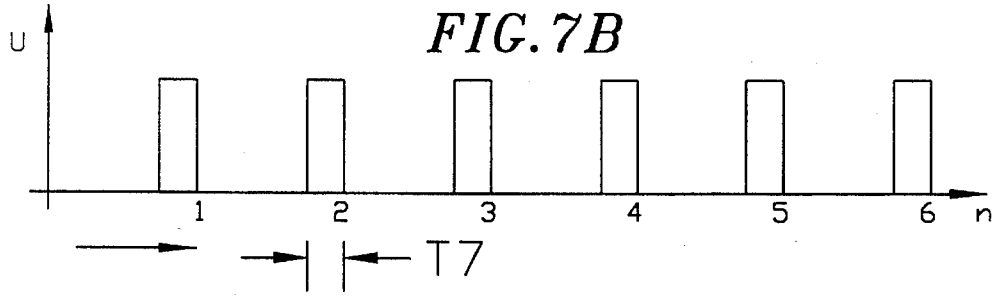
Figure 7C:
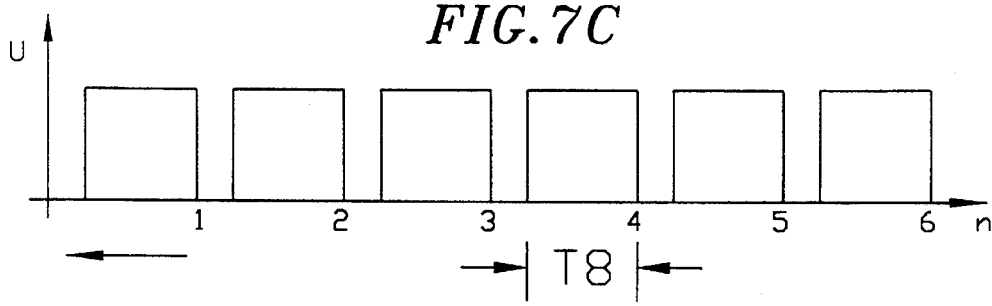

The numerical impulse sequences shown in FIGS. 7b and 7c are produced in dependence on the direction of rotation. Depending on the direction of rotation the individual numerical impulses have a different impulse length T7 or T8. The measured impulse length compared with the period length P thus contains the rotary direction information.

Figure 8:
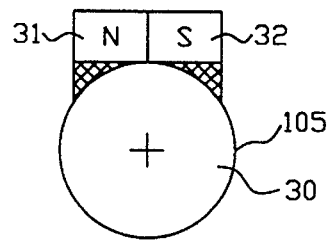
FIG. 8 shows a further signal-transmitting element.
Figure 9:
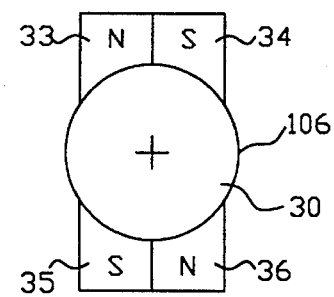
FIG. 9 shows a further signal-transmitting element.

FIGS. 8 and 9 show signal-transmitting elements 105 and 106 whose geometry differ from a ring form. One or two pairs of adjoining N-S magnetized attachments 31, 32 or 33, 34, 35, 36 are mounted on the circumference of the shaft 30 of the rotary drive. The signal-transmitting element 105 according to FIG. 8 produces during rotation a signal which corresponds to the signal of the ring 101 shown in FIG. 4.

The aforementioned embodiments refer to bipolar Hall sensors, i.e., Hall sensors which can detect two opposite magnetic field directions (corresponding to +, −). It should however be pointed out that comparable or identical results can be achieved if unipolar echo sensors are used which only react to one magnetic field direction. The process according to the invention is basically independent of the choice of the Hall sensors used.

Figure 10:
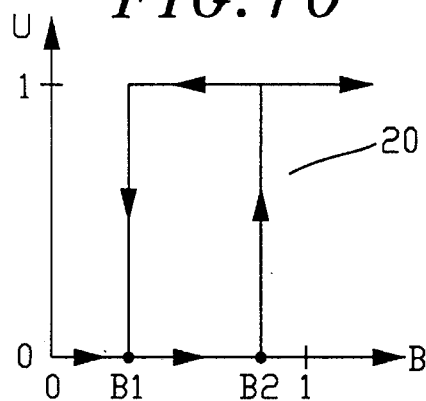
FIG. 10 shows the idealized transmission characteristic line of a unipolar Hall sensor.

The idealized transmission characteristic line 20 (hysteresis curve) of a threshold value switch of a unipolar Hall sensor is shown in FIG. 10. The value 1 thereby corresponds to the possible maximum value. On exceeding a predetermined value B2 of the magnetic field adjoining the sensor the output voltage jumps to HIGH, on falling below a value B1 it jumps back to LOW. By varying the difference B2-B1 known as the switch hysteresis it is possible to vary the length of the numerical impulse of a numerical impulse sequence.

Figure 11:
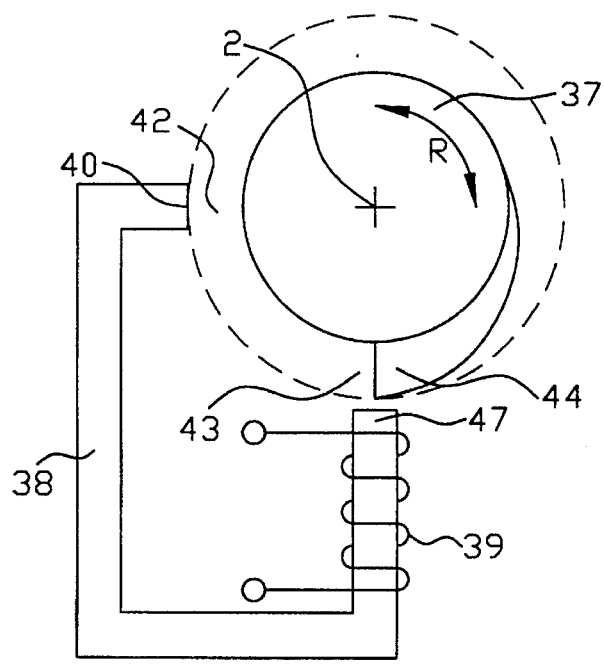
FIG. 11 shows a magnetic circuit with a signal-changing element comprising a core and material attachment.

FIG. 11 shows a magnetic circuit consisting of a permanent magnetic core 37, which represents a part of the shaft of the rotary drive, and of a soft magnetic yoke 38 with a coil 39. Between the two ends 40, 41 of the yoke 38 and the core 37 there are gaps 42, 43 representing a magnetic resistance. The gaps 42, 43 represent a signal transmission path of the magnetic circuit.

Figure 12:
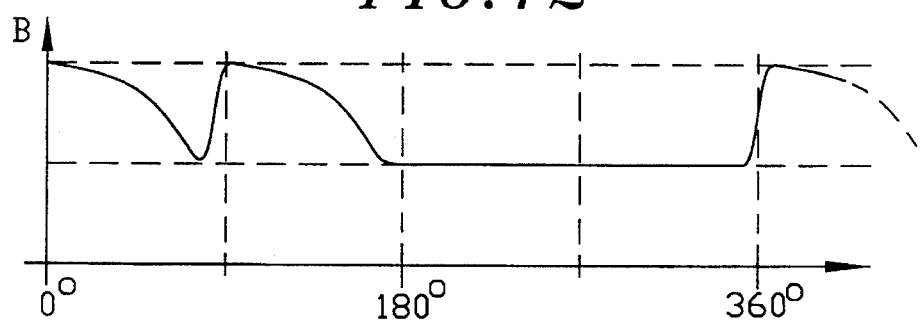
FIG. 12 shows the path of the magnetic flux density of the magnetic circuit according to FIG. 11 with rotation of the signal-changing element over an angular range of 360°.

The core 37 has on its outer circumference a material attachment 44 so that the radius R of the core 37 increases up to a maximum and after reaching the maximum abruptly drops back to a lower value. During rotation of the core 37 together with the material attachment 44, the gaps 42, 43 are periodically filled with the material of the material attachment 44. This leads each time to a reduction in the magnetic resistance of the gaps 42, 43 and thus to an increase in the magnetic flux density of the magnetic circuit. FIG. 12 shows the corresponding path of the magnetic flux density B in the magnetic circuit.

The use of a permanent magnetic yoke 38 in combination with a soft magnetic core 37 is also possible.

In order to evaluate the signal, the current or voltage fluctuations of the current-permeated coil produced by the change in the magnetic flux density, or the voltages and current induced at the coil input are evaluated. A conversion of the signals into binary numerical impulse sequences is not shown here. According to FIG. 12, the signal amplitude rises steeply or slowly depending on the direction of rotation so that the rotary direction information is produced from the evaluation of the signal rise or signal drop. The speed of rotation of the rotary drive is evaluated by counting the number of pulses of the numerical impulse sequence in a defined time interval.

Figure 13:
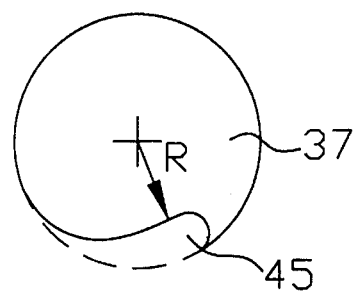
FIG. 13 shows a further signal-changing element consisting of a core and a material recess.

FIG. 13 shows a core 37 with a material recess 45 which, analogous to a material attachment 44, leads to a change in the magnetic flux density of the magnetic circuit. The evaluation of the rotary direction is again produced from the evaluation of the signal rise or drop.

Figure 14:
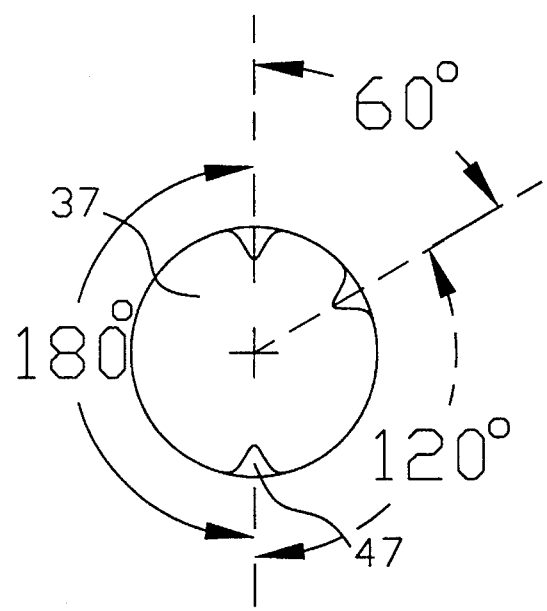
FIG. 14 shows a further signal-changing element consisting of a core and three material recesses.
Figure 15:
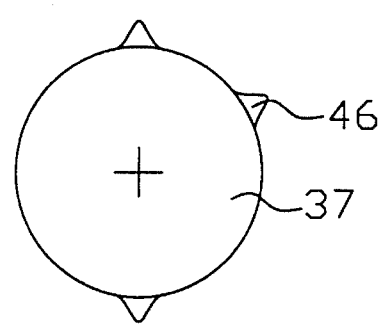
FIG. 15 shows a further signal-changing element consisting of a core and three material attachments.

FIGS. 14 and 15 show cores 37 with material attachments 46 and material recesses 47, respectively, whose angular distances amount to 60°, 120° and 180°. The signal to be evaluated and measured at the coil likewise has maxima and minima at intervals of 60°, 120° and 180°. The rotary direction of the rotary drive results from whether the distances between the maxima and minima increase or decrease within one period.

With these embodiments, not only Hall elements but also impulse switch sensors may be used for signal detection.

In the embodiments shown in FIGS. 11 to 15, the core 37 and the corresponding material attachment or corresponding material recess together each form the signal-changing element.

A preferred use of the invention is in detecting the rotary direction and speed of rotary drives for window winders and sunroofs in motor vehicles. Since the rotary drive stands in a clear mechanical relationship with the translatory moving parts of these structural elements, the position and direction of movement of these parts can be clearly detected from the information regarding the speed and direction of rotation of the rotary drive.

The disclosure of Appendix A is incorporated fully herein by reference.

While the invention has been described in detail with respect to certain preferred embodiments, it should be understood that the invention is not limited to those precise embodiments, and that those embodiments are instead representative examples of the many modifications and variations which would present themselves to those of skill in the art without departing from the scope and spirit of this invention, as defined in the appended claims.

What is claimed is:

1. Apparatus for detecting speed and direction of rotation comprising:

a shaft rotating about an axis;

a permanent magnetic ring having first and second hemicircular sectors of opposite magnetic polarity mounted on the shaft eccentrically about the axis to produce a magnetic flux density distribution around the shaft with at least two unevenly spaced, opposite peaks as a function of angular displacement as the shaft rotates about the axis;

means spaced from the magnetic ring for sensing the magnetic flux density; and means for evaluating the sensed magnetic flux density to determine the speed and direction of shaft rotation.

2. The apparatus of claim 1, in which the sensing means is a Hall device.

3. The apparatus of claim 2, in which the evaluating means measures the time between opposite peaks of the sensed magnetic flux density.

4. The apparatus of claim 3, in which the evaluating means is a Schmitt trigger that has thresholds near the opposite peaks of the sensed magnetic flux density.

5. A device for detecting the speed and direction of rotation of a rotary drive for an adjustment system of a motor vehicle comprising:

a rotary drive;

a permanent magnetic signal-transmitting element which consists of equal size sectors of different polarity arranged evenly along the circumference of the signal-transmitting element and which is connected rotationally secured to the rotary drive for generating a periodic, rotary direction coded signal;

a sensor being locally fixed at a radial distance from the signal-transmitting element, said sensor detecting said periodic, rotary direction coded signal;

an evaluator unit, the input of which is connected to said sensor for evaluating the speed and direction of rotation of the rotary device from said detected signal;

said signal-transmitting element being connected eccentrically to the axis of the rotary drive (so that, depending on the direction of rotation of the signal-transmitting element and caused by variations of the distance between the signal-transmitting element and the sensor, a monotonously decreasing or monotonously increasing intensity of the magnetic signal is detected by the sensor).

6. The device of claim 5, in which the signal-transmitting element is a closed permanent magnetic ring with a circular or polygonal contour which consists of equal size sectors (4, 5) of different polarity (N, S) arranged evenly along the circumference of the ring.

7. The device of claim 5, in which the signal-transmitting element consists of two equal size sectors (4, 5) of different polarity in order to allow a precise determination of the speed of the rotary drive.

8. The device of claim 6, in which the signal-transmitting element consists of two equal size sectors (4, 5) of different polarity in order to allow a precise determination of the speed of the rotary drive.

9. The device of claim 5, in which the signal-transmitting element consists of more than two equal size sectors of different polarity in order to allow a precise determination of the position of the rotary drive.

10. The device of claim 6, in which the signal-transmitting element consists of more than two equal size sectors of different polarity in order to allow a precise determination of the position of the rotary drive.

11. The device of claim 5, in which the sensing is a Hall device.

12. The device of claim 6, in which the evaluating means measures the time between opposite peaks of the sensed magnetic flux density.

13. The device of claim 12, in which the evaluating means is a Schmitt trigger that has thresholds near the opposite peaks of the sensed magnetic flux density.

14. Apparatus for detecting speed and direction of rotation comprising:

a shaft rotating about an axis;

a ring mounted on the shaft, the ring having first and second circumferentially adjacent permanent magnetic sectors of opposite magnetic polarity and a third radially polarized permanent magnetic sector to produce a magnetic flux density distribution around the shaft with at least two unevenly spaced opposite peaks as a function of angular displacement as the shaft rotates about the axis;

means spaced from the ring for sensing the magnetic flux density; and means for evaluating the sensed magnetic flux density to determine the speed and direction of shaft rotation.

15. Apparatus for detecting speed and direction of rotation:

a shaft rotating about an axis;

a ring mounted on the shaft, the ring having first and second permanent magnetic sectors of opposite magnetic polarity that are circumferentially adjacent to each other and third and fourth permanent magnetic sectors of opposite magnetic polarity that are radially adjacent to each other and circumferentially adjacent to the first and second sectors;

means spaced from the ring for sensing the magnetic flux density; and means for evaluating the sensed magnetic flux density to determine the speed and direction of shaft rotation.

* * * * *